(12) United States Patent
Eggum

(10) Patent No.: US 6,880,718 B2
(45) Date of Patent: Apr. 19, 2005

(54) WAFER CARRIER DOOR AND SPRING BIASED LATCHING MECHANISM

(75) Inventor: Shawn D. Eggum, Lonsdale, MN (US)

(73) Assignee: Entegris, Inc., Chaska, MN (US)

( * ) Notice: Subject to any disclaimer, the term of this patent is extended or adjusted under 35 U.S.C. 154(b) by 0 days.

(21) Appl. No.: 10/318,374

(22) Filed: Dec. 11, 2002

(65) Prior Publication Data

US 2003/0132232 A1 Jul. 17, 2003

Related U.S. Application Data

(60) Provisional application No. 60/349,059, filed on Jan. 15, 2002.

(51) Int. Cl.[7] .............................................. B65D 45/28
(52) U.S. Cl. ...................................... 220/323; 206/710
(58) Field of Search ............................... 220/323, 324, 220/326, 297; 206/710; 292/32–37, 40, 41, DIG. 61

(56) References Cited

U.S. PATENT DOCUMENTS

| | | | | |
|---|---|---|---|---|
| 4,639,021 A | * | 1/1987 | Hope ............................. | 292/7 |
| 4,796,778 A | | 1/1989 | Habig et al. | |
| 5,071,023 A | | 12/1991 | Perrot | |
| 5,209,168 A | * | 5/1993 | Chapron et al. .......... | 109/59 T |
| 5,289,930 A | | 3/1994 | Inouye | |
| 5,391,360 A | * | 2/1995 | Kochte et al. .............. | 422/292 |
| 5,482,161 A | | 1/1996 | Williams et al. | |
| 5,957,292 A | | 9/1999 | Mikkelsen et al. | |
| 6,053,347 A | | 4/2000 | Fullin | |
| 6,105,782 A | * | 8/2000 | Fujimori et al. ............ | 206/710 |
| 6,217,088 B1 | * | 4/2001 | Magnusson ................ | 292/165 |
| 6,250,015 B1 | * | 6/2001 | Gillispie ...................... | 49/367 |
| 6,490,895 B1 | * | 12/2002 | Weinerman et al. .......... | 70/208 |

* cited by examiner

*Primary Examiner*—Lien T M Ngo
(74) *Attorney, Agent, or Firm*—Patterson, Thuente, Skaar & Christensen, P.A.

(57) ABSTRACT

A wafer container having a door with at least one latching mechanism, wherein the latching mechanism has a spring member that holds the latching mechanism at one or more favored positions that preferably correspond to latch-open and latch-closed conditions. In a preferred embodiment, the spring member has an over-center condition that urges the latching mechanism towards the favored positions, thereby resisting unintended actuation of the latching mechanism. Moreover, in preferred embodiments, the latching mechanism has soft stops at the latch open or latch closed condition that minimizes abrupt snapping into position of the latching mechanism. Preferred embodiments utilize a rotatable member configured as a cammed member with an elongate rigid plastic member having at least one node, forming a plastic spring. The spring is pivotally mounted on the rotatable member and pivotally mounted to the door structure.

22 Claims, 5 Drawing Sheets

WAFER CARRIER DOOR AND SPRING BIASED LATCHING MECHANISM

This application claims the benefit under 35 U.S.C 119(e) of U.S. Provisional Application No. 60/349,059 filed on Jan. 15, 2002, a copy of which is hereby fully incorporated herein by reference.

FIELD OF THE INVENTION

This invention relates to wafer carriers, and more particularly it relates to sealable wafer enclosures having doors with latching mechanisms.

BACKGROUND OF THE INVENTION

Processing of semi-conductor wafers into finished electronic components typically requires many processing steps where the wafers must be handled and processed. The wafers are very valuable, and are extremely delicate and easily damaged by physical and electrical shocks. In addition, successful processing requires the utmost in cleanliness, free of particulates and other contaminants. As a result, specialized containers or carriers have been developed for use during processing, handling and transport of wafers. These containers protect the wafers from physical and electrical hazards, and are sealable to protect the wafers from contaminants. It is important that the containers remain sealed when in use to prevent damage to the wafers from contaminants. It is also important from a process efficiency standpoint that carriers be easily useable and cleanable.

Various configurations of door enclosures and latching mechanisms for sealable wafer carriers are known in the art. Some known latching mechanisms use rotary members for actuating the latch, such as a cam. A problem, however, with such mechanisms is that the cam member can self-rotate at undesirable times. This self-rotation can cause unlatching of the door and exposure of the wafers to contaminants. When the door is not in place on the carrier, self-rotation can cause extension of the latches, making it difficult to reinstall the door on the carrier. Other latching mechanisms use systems of interlinked latching arms actuated by a rotary or sliding element. Such systems can have similar problems with actuation of the latching mechanism at undesired times and by intended means.

Previous methods used with cam actuated latching mechanisms for restraining cam rotation have typically involved a simple leaf spring with a bent tip arranged tangential to the cam. As the cam is rotated near the rotational limit of travel where it is to be held, a surface or projection of the cam slides past the bent tip of the leaf spring. The cam is then held in position at a favored position by the spring force of the leaf spring and friction between the parts. Such a mechanism does not generally urge or spring-bias the cam member toward the favored position to prevent further cam rotation should the cam be dislodged from the detent. Moreover, if two favored positions are provided corresponding to the latch-open and latch-closed position, two separate leaf springs are needed to adequately address both conditions. This adds complexity to the mechanism and complicates assembly of the parts. The leaf springs, if formed from plastic material, do not generally have sufficient rigidity in bending to generate enough friction to hold the cam in position. Alternatives, such as metallic materials, are undesirable in that sliding contact between such materials can generate damaging particulates. Other known methods involve simple detent systems, involving for example, projections from the cam member that engage structures on the door. Such simple detents, however, can become disengaged at unintended times and by unintended means. Once a detent is disengaged, the simple detent mechanism provides no biasing force urging the cam member back toward the detent to prevent latching or unlatching of the door.

Accordingly, what is needed is a device or apparatus that provides favored positions for a wafer carrier door latching mechanism, and that also provides some type of biasing force urging the latching mechanism toward the favored positions to resist further movement of the latch in the event it is dislodged from the favored positions.

SUMMARY OF THE INVENTION

A wafer container with a door having at least one latching mechanism, wherein the latching mechanism has a spring member that holds the latching mechanism at one or more desired positions that preferably correspond to latch-open and latch-closed conditions. In a preferred embodiment, the spring member has an over-center condition that urges the latching mechanism towards the favored positions, thereby resisting unintended actuation of the latching mechanism. Moreover, in preferred embodiments, the latching mechanism has soft stops at the latch open or latch closed condition that minimizes abrupt snapping into position of the latching mechanism. Preferred embodiments utilize a rotatable member configured as a cammed member with an elongate rigid plastic member having at least one node, forming a plastic spring. The spring is pivotally mounted on the rotatable member and pivotally mounted to the door structure.

DETAILED DESCRIPTION OF THE INVENTION

Figure 1:
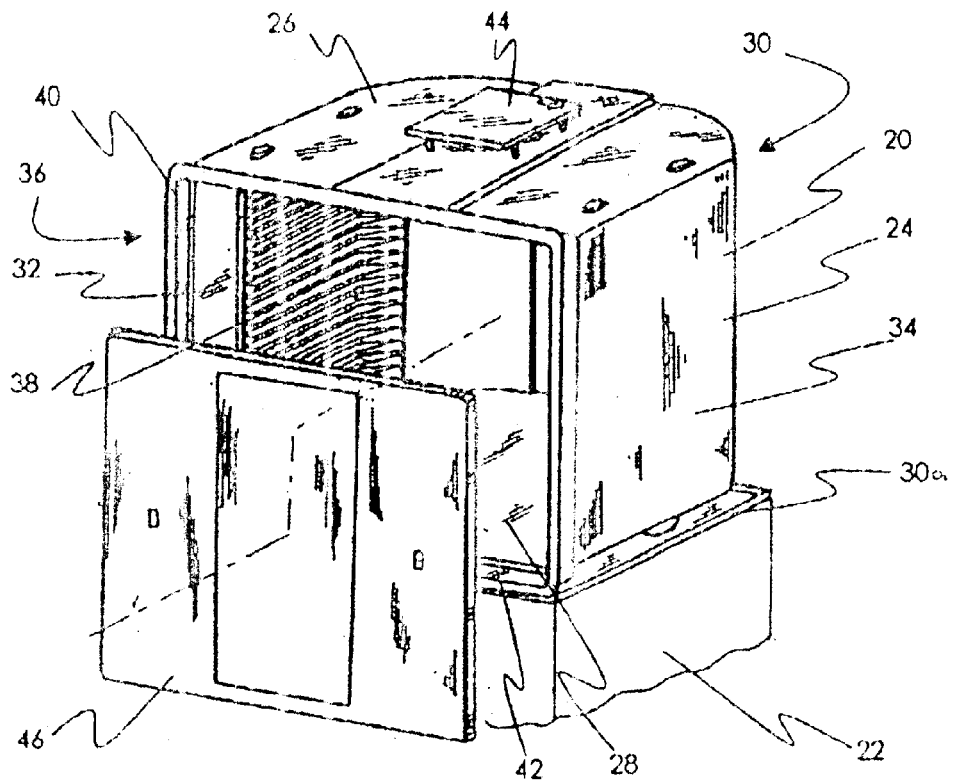
FIG. 1 is a perspective view of a wafer carrier with a machine interface on a piece of processing equipment.

Referring to FIG. 1, a wafer carrier 20, is seated on automated processing equipment 22. The wafer carrier comprises a container portion 24 including a top 26, a bottom 28, a back 30, a pair of opposing sides 32 and 34, and an open front 36. Inside the container portion 24 are supports 38 for holding a plurality of horizontally aligned and spaced wafers. A machine interface 30a is attached to the exterior of the bottom 28 of the container. Open front 36 is defined by a door frame 40 with latch receptacles 42. The container portion 24 further has a robotic flange 44 on the top 26 of the container portion. A wafer carrier door 46 fits into the door frame 40 to close the open front.

Figures 3, 8:
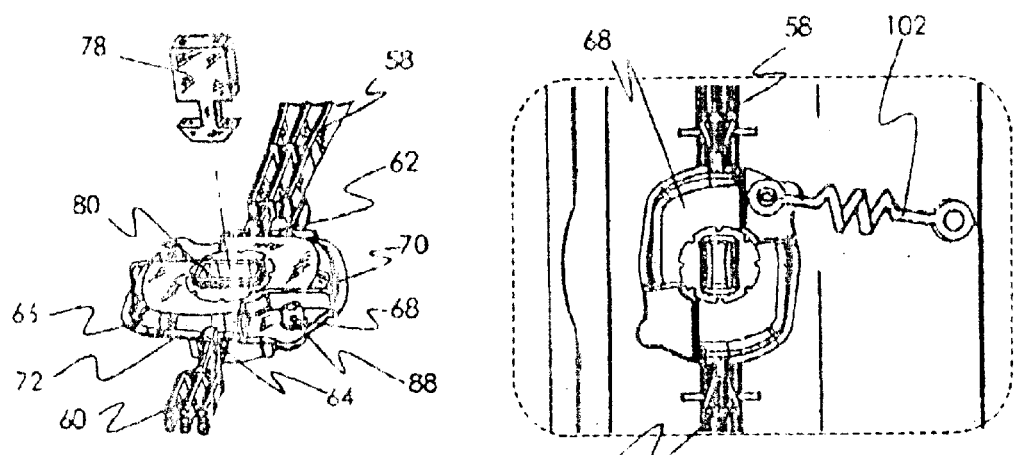
FIG. 3 is a partial perspective view of the latch assembly.
FIG. 8 is a partial plan view of yet another alterative embodiment of the latch assembly.
Figure 2:
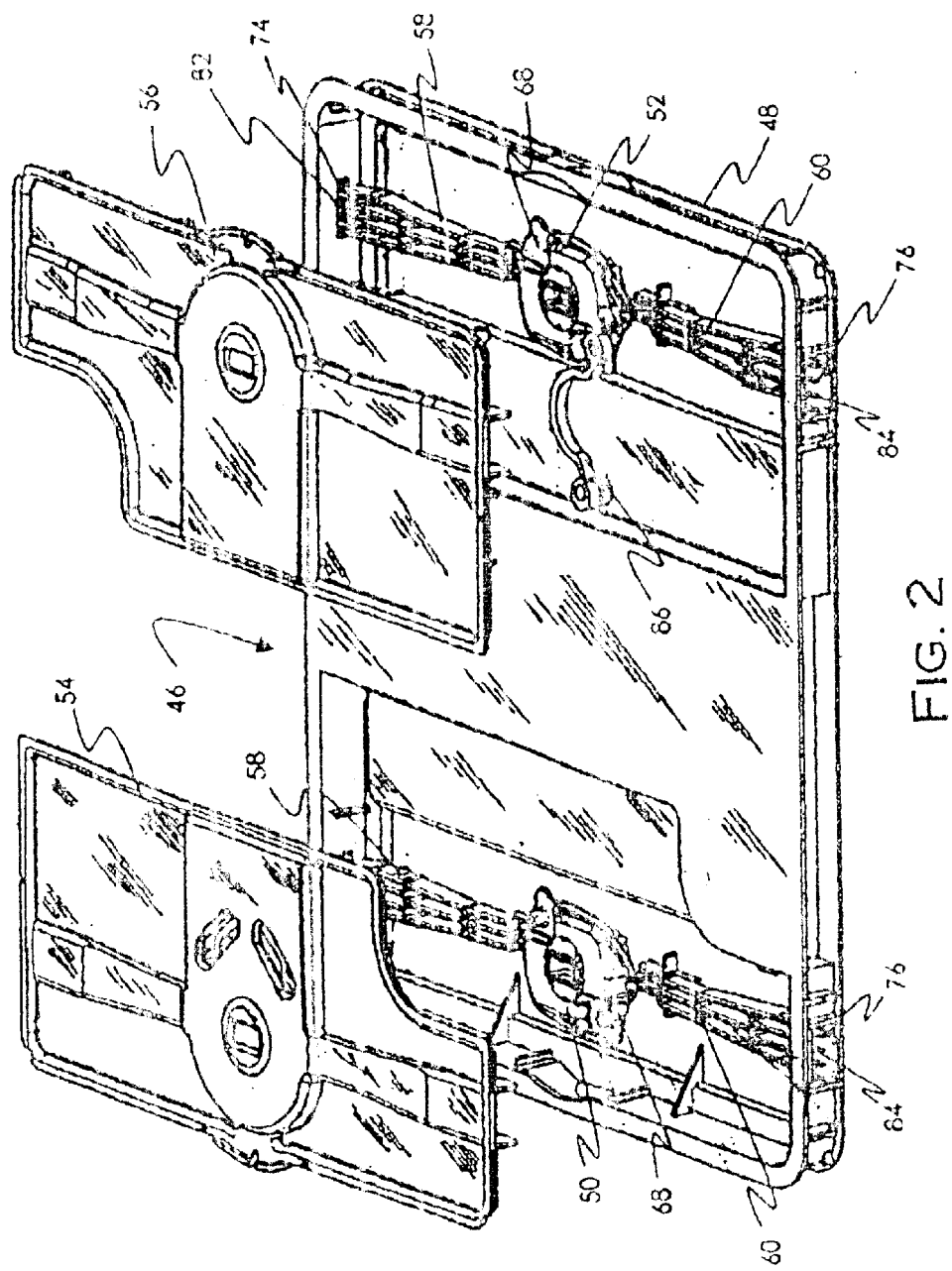
FIG. 2 is a perspective view of a wafer carrier door with latching assemblies exposed.

Referring to FIGS. 1–3, door 46 generally includes door chassis 48, latching mechanisms 50, 52, and mechanism covers 54, 56. FIG. 3 depicts a partial view of latching mechanism 50 in exemplary fashion. The mechanism shown has a rotary actuating member in the form of cam member 68. Latching arms 58, 60, each have a cam follower portion 62, 64, respectively, engaged with the periphery 66 of cam member 68 at cam portions 70, 72. As depicted in FIG. 3, each of latching arms 58, 60, has a latching portion 74, 76, at the end opposite from cam follower portions 62, 64. When key 78 is inserted into key slot 80 and rotated, cam follower portions 62, 64, slide along cam portions 70, 72. Due to the shape of cam member 68, latching arms 58, 60, are translated radially, extending or retracting latching portions 74, 76, through latch openings 82, 84. Latching portions 74, 76, are received by latch receptacles 42 in the wafer carrier, allowing the door to be secured in place. Mechanism covers 54, 56, serve to protect the latching mechanisms 50, 52 from physical damage and contamination, and to serve as guides for latching arms 58, 60.

Figures 4, 5:
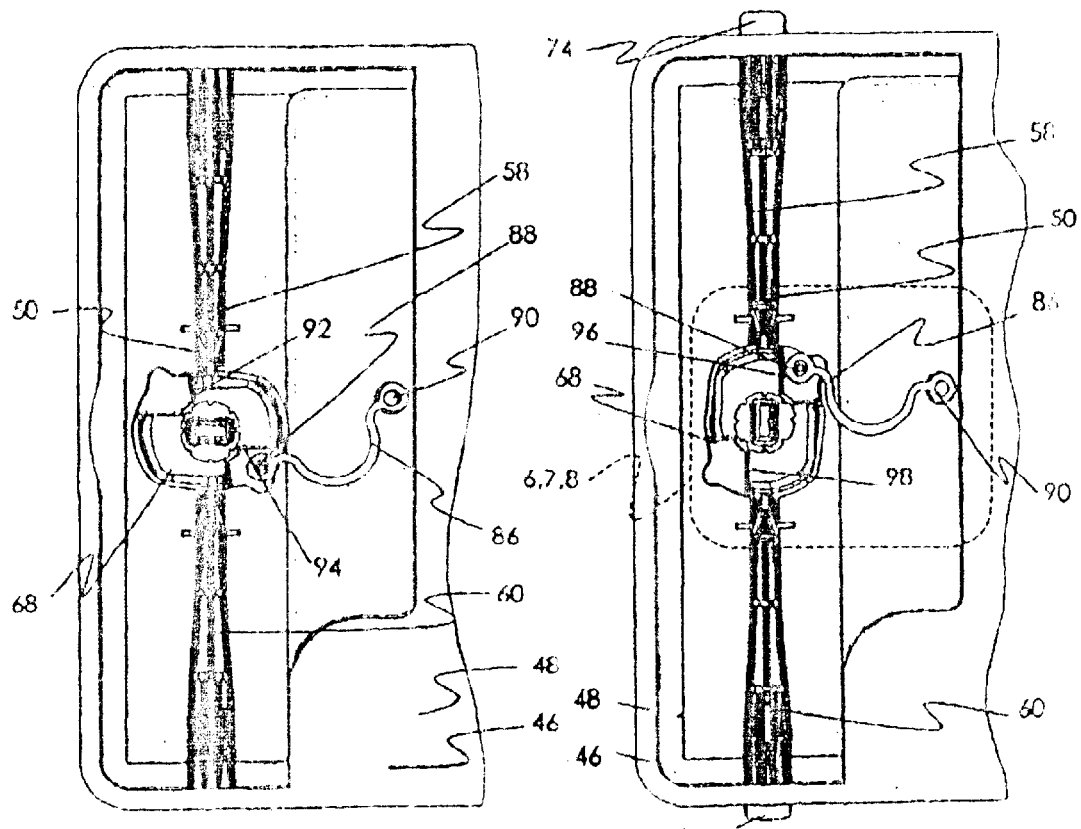
FIG. 4 is a plan view of a preferred embodiment of the latch assembly depicting the latch in the open position.
FIG. 5 is a plan view of the embodiment of FIG. 4 depicting the latch in the closed position.

A preferred embodiment of the invention is depicted in FIGS. 4 and 5. In FIG. 4, latching mechanism 50 is shown in the open position with latching arms 58, 60, fully retracted. Spring member 86 is pivotally attached to cam member 68 at pivot 88 and is also pivotally attached to door chassis 48 at spring pivot 90. Spring member 86 restrains cam member 68 rotationally and is neutrally biased, exerting no biasing force on cam member 68 in the position shown. Thus, spring member 86 provides a favored position for latching mechanism 50 in this position. If cam member 68 is rotated clockwise, however, spring member 86 will be biased in tension and will exert a steadily increasing biasing force in a counter-clockwise direction. This counter-clockwise biasing force serves as a "soft" rotational stop for cam member 68 in the clockwise rotational direction from the favored position. If cam member 68 is rotated further in the clockwise direction, cam follower portions 62, 64, eventually contact mechanical stops 92, 94, on cam member 68.

If cam member 68 is rotated counter-clockwise from the neutral position depicted, spring member 86 is biased in compression and initially exerts a steadily increasing rotational biasing force on cam member 68 in a clockwise rotational direction. As cam member 68 is rotated further counter-clockwise and reaches the mid-point of its rotational travel range, the biasing force of spring member 86 is directed through the center of cam member 68. In this position, spring member 86, although compressed, exerts no rotational biasing force on cam member 68. As cam member 68 is further rotated in the counter-clockwise direction past the mid-point of its rotational travel range, spring member 86 exerts a biasing force, now urging cam member 68 in the counter-clockwise direction. As cam member 68 rotates further in the counter-clockwise direction, the rotational biasing force exerted by spring member 86 steadily decreases as spring member 86 decompresses.

Once cam member 68 reaches the fully latched position as depicted in FIG. 5, spring member 86 once again reaches a neutral position and exerts no rotational biasing force in either direction. Thus, spring member 86 has another favored position in this location. As before, if cam member 68 is rotated further counter-clockwise from this neutral position, spring member 86 is loaded in tension and exerts a steadily increasing rotational biasing force urging the cam member clockwise. Eventually, as cam member is turned further counter-clockwise, cam follower portions 62, 64, contact mechanical stops 96, 98, on cam member 68.

The latching mechanism illustrated in FIGS. 4 and 5 has a number of distinct advantages. First, spring member 86 provides two favored positions for cam member 68 corresponding to the neutral positions described above. These favored positions are created with a single spring member and without the need for sliding contact between parts that can cause undesirable particulates. Secondly, spring member 86 provides a rotational biasing force, urging cam member 68 toward either of the favored positions, depending on the rotational position of cam member 68. In operation, cam member 68 experiences about 90 degrees of rotational travel range. Spring member 86 provides a rotational biasing force over nearly the entire range, exerting no biasing force only when cam member 68 is at the mid-point of its rotational range, and when it is at either of the two favored positions. Thus the effective rotational range where spring member 86 provides a rotational biasing force urging cam member 68 toward its favored positions is nearly 45 degrees in each direction. Finally, as explained above, spring member 86 provides a biasing force resisting rotation of cam member 68 beyond each of its favored positions. As a result, when cam member 68 is rotated to either of its favored positions, it is decelerated in a controlled fashion by spring member 86 as it moves past the favored position, and its momentum is absorbed. Once the momentum has been absorbed, spring member 86 contracts, pulling cam member 68 to its favored position. The result is that the favored positions are "soft", and do not involve the collision of mechanical parts, which can generate vibrations. Such vibrations are undesirable in that they can tend to "launch" any particulate matter present on the door or in the container, creating the possibility of contamination of the wafers. Another advantage of avoiding the collision of mechanical parts as in "hard" favored positions is that such collisions can themselves generate undesirable particulates.

The material and geometry of spring member 86 may be selected so that sufficient bias force is exerted to effectively prevent unintended rotation of cam member 68, but is not excessive so as to unduly hinder intended rotation of cam member 68 when operated in use. In the preferred embodiment of FIGS. 4 and 5, spring member 86 may be comprised of thermoplastic material, but could be made from any compatible resilient material suitable for use in a wafer container. The material may also be made electrically conductive if desired, for instance, by the addition of carbon fiber fill, to provide electrical conductivity for a grounding path.

Figures 6, 7:
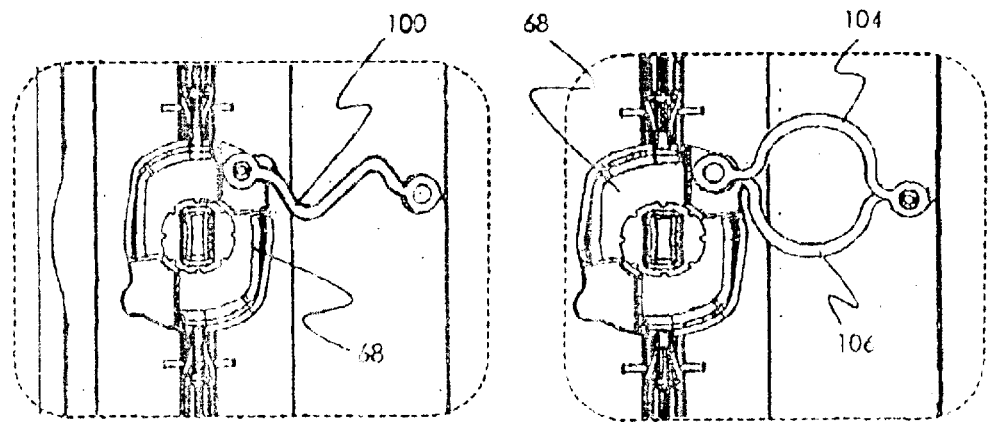
FIG. 6 is a partial plan view of an alternative embodiment of the latch assembly.
FIG. 7 is a partial plan view of another alternative embodiment of the latch assembly.

It will be appreciated that, by varying the length, cross-section and material used for spring member 86, it is possible to achieve a range of the amount of spring biasing force exerted by spring member 86. It is preferable that the spring biasing force be effective for at least 5 degrees of the rotational travel range of cam member 68 proximate to each favored position, but a range of up to nearly 45 degrees of the rotational travel range proximate to each favored position is possible as described above. In addition, although spring member 86 is depicted as having an arcuate shape, other geometries are possible and are within the scope of the invention, such as the s-shaped spring 100 of FIG. 6, or the coil spring 102 of FIG. 8. Two or more spring members 104, 106, of smaller dimension may be used if desired, as depicted for example in FIG. 7. In addition, one or more torsion springs disposed within cam member 68 could be used to similar effect.

Figures 9, 10:
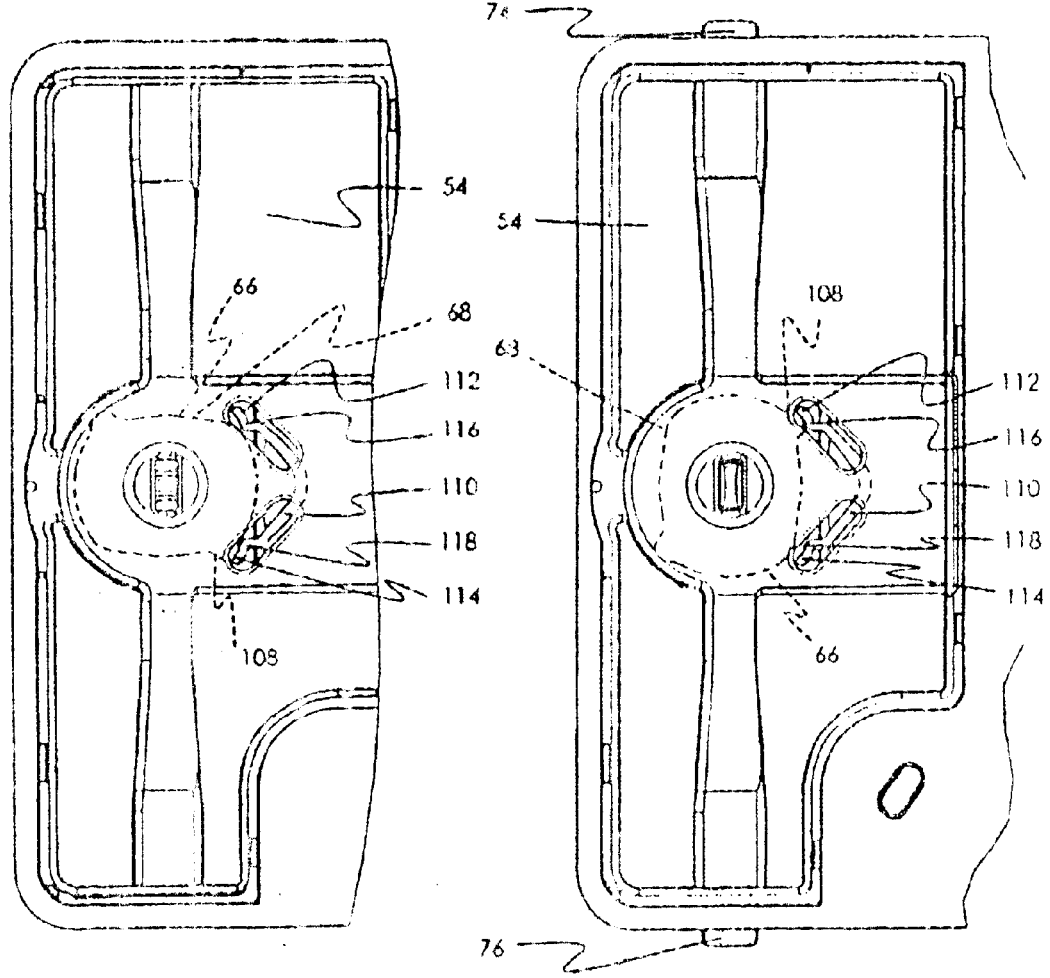
FIG. 9 is a plan view of another embodiment of the latch assembly depicting the latch in the open position.
FIG. 10 is a plan view of the embodiment of FIG. 9 depicting the latch in the closed position.

Another embodiment of the invention is depicted in FIGS. 9 and 10. In this embodiment, cam member 68 has radial protuberance 108. Arcuate shaped spring member 110 is mounted to mechanism cover 54 at a point intermediate tips 112, 114. Spring member 110 has a v-shaped bends 116, 118, proximate tips 112 and 114 respectively. Tips 112 and 114 are shaped conformingly to protuberance 108. When mechanism cover 54 is installed on door chassis 48, tips 112, 114, are proximate to the periphery 66 of cam member 68. When cam member 68 is at a position corresponding to a latch-closed condition as shown in FIG. 10, protuberance 108 of cam member 68 is engaged and captured with tip 112, providing a favored position for cam member 68. Spring member 110 is not loaded and thus has a neutral bias in this position. As cam member 68 is rotated clockwise, v-shaped bend 116 rides over protuberance 108, biasing spring member 110 in bending. The resilience of spring member 110 exerts a biasing force acting through v-shaped bend 116, tangential to protuberance 108. This biasing force urges cam member 68 in a counter-clockwise direction, resisting the clockwise rotation. As cam member 68 is rotated further clockwise, protuberance 108 clears v-shaped bend 116, and spring member 110 returns to an unloaded condition.

Spring member 110 remains out of contact with cam member 68 and exerts no rotational biasing force on it until cam member 68 nears a position corresponding to a latch-open condition depicted in FIG. 9, and protuberance 108 contacts v-shaped bend 118. As cam member 68 is rotated further clockwise, v-shaped bend 118 rides over protuberance 108 again loading spring member 110 in bending. Once protuberance 108 clears v-shaped bend 118, the resilience of spring member 110 acting through v-shaped bend 118 urges cam member 68 clockwise. Protuberance 108 is captured and held by the shape of tip 114, constituting a favored position for cam member 68 corresponding to a latch-open condition. Spring member 110 once again has a neutral bias in this position. If cam member 68 is rotated further clockwise from this position, the distal end of tip 114 is pressed radially outward by protuberance 108, biasing spring member 110 in bending. Consequently, spring member 110 exerts a biasing force directed radially inward, increasing the sliding friction between the distal end of tip 114 and radial protuberance 108. Thus, a force resisting rotation of cam member 68 clockwise beyond the favored position is provided. If cam member 68 is rotated still further clockwise, cam follower portions 62 and 64 contact mechanical stops 92 and 94 on cam member 68, but before the distal end of tip 114 clears protuberance 108.

In the embodiment shown in FIGS. 9 and 10, spring member 110 exerts a biasing force urging cam member 68 toward each of the two favored positions for a rotational range of cam member 68 of about 5–15 degrees surrounding each favored position, thus resisting disengagement of the cam member 68 from the favored positions. In addition, this embodiment also has the advantage of "soft" favored positions, due to the biasing force provided by the distal end of tips 112 and 114 against protuberance 108 as cam member 68 rotates in either direction past the favored positions.

In the embodiments shown in FIGS. 9 and 10, spring member 110 and cam member 68 are made from thermoplastic material, each preferably having abrasion resistant qualities. As will be appreciated, however, the scope of the invention includes members made from any suitable and compatible materials.

Figure 11:
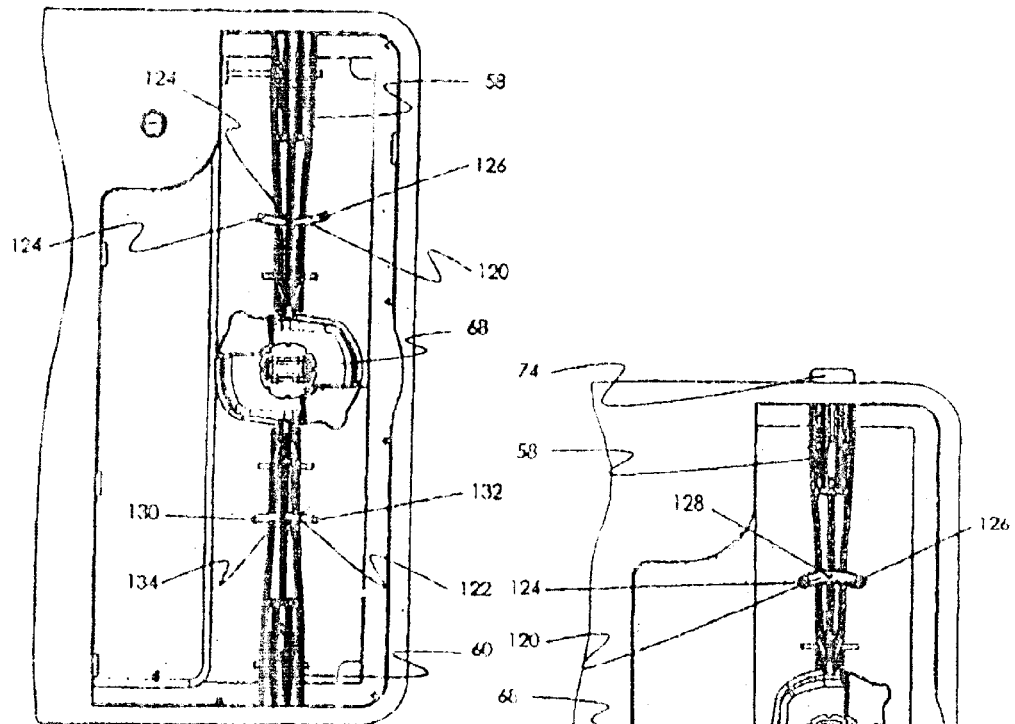
FIG. 11 is a plan view of another alternative embodiment of the latch assembly depicting the latch in the open position.
Figure 13:
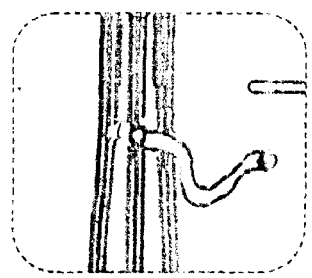
FIG. 13 is a partial plan view of an alternative embodiment of the latch assembly of FIGS. 11 and 12.
Figure 12:
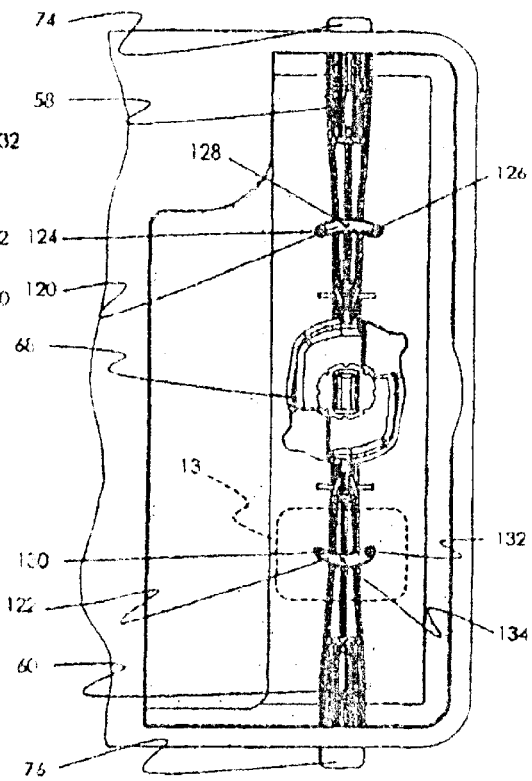
FIG. 12 is a plan view of the embodiment of FIG. 11 depicting the latch in the closed position.

The latching arms themselves, rather than the rotating element of a latch assembly, may be provided with a spring bias toward favored positions, as shown for example in FIGS. 11–13. Although depicted with a rotary actuating member, such an assembly would be particularly well adapted for a latch mechanism having no rotary actuating member, using for instance, a four bar linkage for actuation. Spring members 120, 122, in this embodiment of the invention function similarly to a Belleville type spring. Two favored positions are provided, corresponding to a latch-open and a latch-closed position. Spring member 120 is mounted between pivots 124, 126, and is attached to latching arm 58 at center pivot 128. Similarly, spring member 122 is mounted between pivots 130, 132, and is attached to latching arm 60 at center pivot 134. Each of spring members 120, 122, is normally straight, but slightly longer than the distance between the pivots to which it is attached. Thus, spring members 120, 122, take on a slightly arcuate shape when installed between the pivots and with no load applied as depicted in FIGS. 11 and 12.

When cam member 68 is rotated counter-clockwise from the latch-open detent position depicted in FIG. 11, latching arms 58, 60, are translated radially outward along the longitudinal axis of each latching arm, causing center pivots 128, 134, to also move radially outward. Spring members 120, 122, are consequently loaded in compression, and exert a force acting through center pivots 128, 134, resisting the radial movement of latching arms 58, 60. When center pivot 128 reaches a point on a line directly between pivots 124, 126, and center pivot 134 reaches a point on a line directly between pivots 130, 132, each spring member 120, 122, is fully compressed and exerts no radial biasing force on latching arms 58, 60.

When cam member 68 is rotated further counter-clockwise so that center pivots 128, 134, move further radially outward, spring members 120, 122, begin to decompress and exert a force directed radially outward, urging latching arms 58, 60, toward the latch-closed favored position depicted in FIG. 12. When latching arms 58, 60, are fully extended as shown in FIG. 12, spring members 120, 122, are once again in a neutral position, exerting no biasing force on latching arms 58, 60.

It will be appreciated that, by varying the length, cross-section and material used for spring members 120, 122, it is possible to achieve a range of the amount of spring biasing force exerted by spring members 120, 122. It is preferable that the spring biasing force is effective for at least 10% of the longitudinal travel range of the latching arms proximate to each favored position, but a range up to nearly 50% of the longitudinal travel range proximate to each favored position is possible.

Another embodiment wherein a biasing force is provided directly to the latching arms using a spring arrangement having a single pivot on the door chassis is illustrated in FIG. 13. Those of skill in the art will recognize that many other such variations are possible and are within the scope of the invention.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims. Although the description above contains many specificities, these should not be construed as limiting the scope of the invention but as merely providing illustrations of some of the presently preferred embodiments of the invention. Thus, the scope of the invention should be determined by the appended claims and their legal equivalents, rather than by the examples given.

What is claimed is:

1. A wafer container, comprising:
   a container portion including a top, a bottom, a pair of opposing sides, a back and an open front;
   a pair of wafer supports in the container portion for holding a plurality of horizontally aligned and spaced wafers; and
   a door to sealingly close the open front, the door comprising:
   a door chassis;
   at least one latching mechanism on the door chassis, said latching mechanism having at least one rotary actuating member; and
   at least a first spring member operably coupled with the door chassis, said spring member adapted to engage the rotary actuating member and disposed so as to hold the rotary actuating member at a first favored position, said spring member adapted to urge said rotary actuating member toward the first favored position over a first rotational range of said rotary actuating member of at least 5 degrees proximate to the first favored position.

2. The wafer container of claim 1, wherein said spring member is neutrally biased when said rotary actuating member is at the first favored position.

3. The wafer container of claim 1, wherein said spring member is also disposed to hold the rotary actuating member at a second favored position and is adapted to urge said rotary actuating member toward the second favored position over a second rotational range of said rotary actuating member of at least 5 degrees proximate to the second favored position.

4. The wafer container of claim 3, wherein said spring member is neutrally biased when said rotary actuating member is at the second favored position.

5. The wafer container of claim 1, wherein said spring member has an arcuate shape.

6. The wafer container of claim 1, wherein said spring member has an s-shape.

7. The wafer container of claim 1, wherein said spring member is a coil spring.

8. The wafer container of claim 1, wherein said spring member is a torsion spring.

9. A wafer container, comprising:
   a container portion including a top, a bottom, a pair of opposing sides, a back and an open front;
   a pair of wafer supports in the container portion for holding a plurality of horizontally aligned and spaced wafers; and
   a door to sealingly close the open front, the door comprising:
   a door chassis, having at least a first spring pivot;
   at least one latching mechanism on the door chassis, said latching mechanism having at least one rotary actuating member, the rotary actuating member having a pivot; and
   at least a first spring member, said spring member operably coupled to the spring pivot of said door chassis and to the pivot of the rotary actuating member, said spring member disposed so as to hold the rotary actuating member at a first favored position and adapted to urge said rotary actuating member toward the first favored position over a first rotational range of said rotary actuating member of at least 5 degrees proximate to the first favored position.

10. The wafer container of claim 9, wherein said spring member is neutrally biased when said rotary actuating member is at the first favored position.

11. The wafer container of claim 9, wherein said spring member is also disposed to hold the rotary actuating member at a second favored position and is adapted to urge said rotary actuating member toward the second favored position over a second rotational range of said rotary actuating member of at least 5 degrees proximate to the second favored position.

12. The wafer container of claim 10, wherein said spring member is neutrally biased when said rotary actuating member is at the second favored position.

13. The wafer container of claim 11, further comprising a second spring member pivotally coupled to the spring pivot of the door chassis and to the pivot of the rotary actuating member.

14. The wafer container of claim 9, wherein said spring member has an arcuate shape.

15. The wafer container of claim 9, wherein said spring member has an s-shape.

16. The wafer container of claim 9, wherein said spring member is a coil spring.

17. A wafer container, comprising:
   a container portion including a top, a bottom, a pair of opposing sides, a back and an open front;
   a pair of wafer supports in the container portion for holding a plurality of horizontally aligned and spaced wafers; and
   a door to sealingly close the open front, the door comprising:
   a door chassis;
   at least one latching mechanism on the door chassis, said latching mechanism having a rotary actuating member;
   means for providing said latching mechanism with at least a first favored position; and
   spring means for urging said latching mechanism toward the first favored position over a rotational range of the rotary actuating member of at least 5 degrees proximate to the first favored position.

18. The wafer container of claim 17, wherein said means for providing said latching mechanism with at least a first favored position, and said spring means comprise at least a first spring member, said spring member coupling the rotary actuating member with said door chassis.

19. The wafer container of claim 18, wherein said spring member is also disposed to hold the rotary actuating member at a second favored position and is adapted to urge said rotary actuating member toward the second favored position over a second rotational range of said rotary actuating member of at least 5 degrees proximate to the second favored position.

20. The wafer container of claim 17, further comprising:
   means for providing said latching mechanism with at a second favored position; and
   spring means for urging said latching mechanism toward the second favored position over a rotational range of the rotary actuating member of at least 5 degrees proximate to the second favored position.

21. The wafer container of claim 20, wherein said means for providing said latching mechanism with at least a first favored position, said means for providing said latching mechanism with at a second favored position, said spring means for urging said latching mechanism toward a first favored position and said spring means for urging said latching mechanism toward a second favored position comprise at least a first spring member, said spring member coupling the rotary actuating member with said door chassis.

22. A wafer container, comprising:

a container portion including a top, a bottom, a pair of opposing sides, a back and an open front;

a pair of wafer supports in the container portion for holding a plurality of horizontally aligned and spaced wafers; and a door to sealingly close the open front, the door comprising:

a door chassis;

at least one latching mechanism on the door chassis comprising:

a plurality of latching arms;

a rotary actuating member operably coupled engaged with said plurality of latching arms; and at least one spring member adapted and disposed so as to urge said at least one latching mechanism toward a first favored position over a first rotational range of said rotary actuating member of at least 5 degrees proximate to the first favored position.

* * * * *